United States Patent [19]

Phillips et al.

[11] 4,425,537
[45] Jan. 10, 1984

[54] X-Y ADDRESSABLE WORKPIECE POSITIONER AND MASK ALIGNER USING SAME

[75] Inventors: Edward H. Phillips, Mountain View; Karl-Heinz Johannsmeier, Los Altos, both of Calif.

[73] Assignee: Optimetrix Corporation, Mountain View, Calif.

[21] Appl. No.: 198,364

[22] Filed: Oct. 20, 1980

Related U.S. Application Data

[63] Continuation of Ser. No. 918,713, Jun. 26, 1978, abandoned.

[51] Int. Cl.³ .............................................. G05B 1/06
[52] U.S. Cl. .................................... 318/640; 318/480; 318/577
[58] Field of Search ...................... 318/640, 480, 577; 250/201

[56] References Cited

U.S. PATENT DOCUMENTS

| | | | |
|---|---|---|---|
| 3,634,689 | 1/1972 | Kamoi et al. | 250/201 |
| 3,821,545 | 6/1974 | Nakagawa et al. | 250/201 |
| 3,902,615 | 9/1975 | Levy et al. | 250/201 |
| 3,943,359 | 3/1976 | Matsumoto | 318/640 X |

Primary Examiner—B. Dobeck
Attorney, Agent, or Firm—Roland I. Griffin; Harry E. Aine

[57] ABSTRACT

In an X-Y addressable workpiece positioner the workpiece to be positioned, such as a semiconductive wafer to be aligned with a mask image, is coupled to move with a work stage moveable in the X-Y direction and having a two-dimensional array of positioning indicia affixed thereto for movement therewith. An enlarged image of a portion of the positioning array is projected onto a relatively stationary sensor stage to derive an output determinative of the X and Y coordinates of the positioning array relative to the position of the sensor. The sensed X and Y coordinates of the positioning array are compared with the X and Y coordinates of a reference positioning address to derive an error output. The work stage is moved in response to the error output for causing the workpiece to be positioned to the reference address. In a preferred embodiment of a mask aligner, the approximately stationary sensing stage is moved relative to the enlarged image of the positioning array for interpolating the X and Y coordinates of the sensed address. A viewing system is arranged for permitting the operator to superimpose the image of a pattern on the reference addressed position of the semiconductive wafer with a mask image. The sensing stage is moved by the operator to obtain precise registration of the images, thereby zeroing the reference position address to the interpolated value. The machine then sequentially steps the interpolated (zeroed) reference position address by predetermined increments, related to the size mask pattern to be projected onto the wafer, to cause the wafer to be sequentially exposed to the mask pattern in different regions thereof.

12 Claims, 6 Drawing Figures

X-Y ADDRESSABLE WORKPIECE POSITIONER AND MASK ALIGNER USING SAME

CROSS REFERENCE TO RELATED APPLICATION

This is a continuation of application Ser. No. 918,713 filed June 26, 1978 now abandoned.

BACKGROUND OF THE INVENTION

The present invention relates in general to X-Y addressable workpiece positioners and, more particularly, to an improved positioner particularly useful for aligning an optical mask with an addressed position of a semiconductive wafer.

DESCRIPTION OF THE PRIOR ART

Heretofore, X-Y addressable workpiece aligners have been proposed in which a mask was sequentially aligned with different X-Y coordinates of a semiconductive wafer for sequentially exposing portions of the wafer to the mask pattern for processing of integrated circuits on the wafer. One such prior art device is manufactured by Jade Manufacturing Co., as a mask exposure machine.

In this machine, the wafer workpiece is sequentially addressed relative to a mask pattern to be exposed onto the wafer. The addressed X and Y coordinates of the wafer are aligned with the mask pattern by means of X and Y indicia comprised of two separate one dimensional arrays of X and Y scribed parallel lines affixed to the X-Y moveable stage having the wafer affixed thereto. Sensors are set up to sense the X and Y coordinates of an addressed location of the wafer by sensing the X and Y scribe lines of the addressing array. X and Y servo motors responsive to the sensed address move the work stage to the position selected by the operator as a reference address.

However, the work stage does not move simultaneously in both the X and Y directions to the addressed location. The reference addressed location is positioned by the sensor by first sensing the Y coordinate of the address and causing the work stage to move to the addressed Y coordinate. Then the work stage is caused to sequentially search through the X coordinate values in the X direction until the selected X coordinate value is sensed.

This system has the disadvantage that the work stage cannot move along the shortest path from a first addressed position to a second addressed position, but, on the contrary must return to the Y coordinate indicia along the marginal edge of the X coordinate values and then search through the X coordinate values until the desired X coordinate is obtained. In addition, this system depends for its accuracy upon the orthogonality of Y axis bearing support to the X axis of the work stage that is aligned with the selected Y coordinate. While this orthogonality tolerance can be accurately controlled, it becomes an expensive component.

It is also known, from the prior art in such addressable workpiece aligners, to employ a mirror affixed to the X-Y stage for movement therewith and thus for movement with the workpiece. A laser beam is directed onto the mirror in such a manner as to derive X and Y interference fringes of the laser beam, such fringes being counted for precisely positioning the workpiece in both the X and Y coordinates.

The problem with this scheme is that the standard for determining the position of the workpiece in both the X and Y coordinates is the wavelength of the laser light. The wavelength of the laser is a function of the temperature, pressure and humidity of the optical path used to determine the interference fringes. As a consequence, the interferometer method requires that the work stage be contained within an environmental chamber for controlling the temperature, pressure and humidity to a very high degree. Such a chamber is relatively expensive and complicates the machine.

Therefore, a less expensive and less complicated X-Y addressable stage is desired which is capable of addressing the workpiece to a sequence of repeatable address locations with an accuracy of better than a 10th of a micron. It is also desired that the addressable work stage move in a more direct path from a first address location to a subsequent address location so as to reduce the search time in moving between the sequential addresses.

SUMMARY OF THE PRESENT INVENTION

The principal object of the present invention is the provision of an improved X-Y addressable workpiece positioner and mask aligner using same.

In one feature of the present invention, the workpiece to be positioned is affixed to a work stage moveable along X and Y coordinates with a common two-dimensional array of X-Y coordinate indicia affixed to the moveable work stage. A relatively stationary sensor stage senses an enlarged image of at least a portion of the X-Y coordinate indicia and means responsive to the sensed coordinates are provided for driving the X-Y work stage from a first address to a subsequent address.

In another feature of the present invention, the relatively stationary sensing stage includes means for moving the sensing stage relative to the projected image of the X-Y coordinate indicia for interpolating the X and/or Y coordinates of the sensed address for causing the workpiece to be moved to the interpolated sensed address.

In another feature of the present invention, the image of an addressed portion of a workpiece surface, such as a semiconductive wafer, and the stationary image of a pattern to be aligned with the addressed surface portion of the workpiece or wafer are superimposed and the relatively stationary sensing stage is moved relative to precisely align the two images for interpolating the coordinates of the sensed address, thereby causing the workpiece or wafer which is being sequentially moved to predetermined addressed locations to be moved to the interpolated sensed address locations. In this manner, the sequential stepping of the image pattern, such as a mask pattern, to predetermined address locations on the wafer causes these addressed location to be corrected, i.e., zeroed, for the actual wafer location on the work stage.

Other features and advantages of the present invention will become apparent upon a perusal of the following specification taken in connection with the accompanying drawings wherein:

DESCRIPTION OF THE PREFERRED EMBODIMENTS

Figure 1:
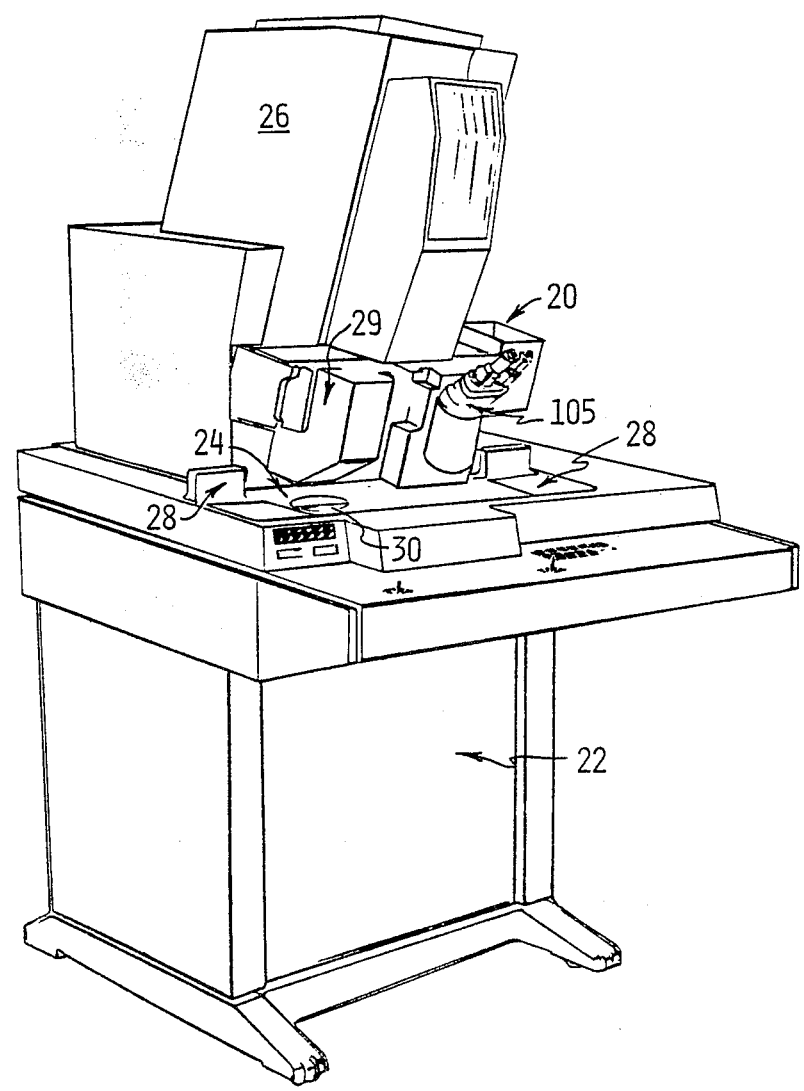
FIG. 1 is a perspective view of a step and repeat mask aligner employing features of the present invention.
Figures 2, 3:
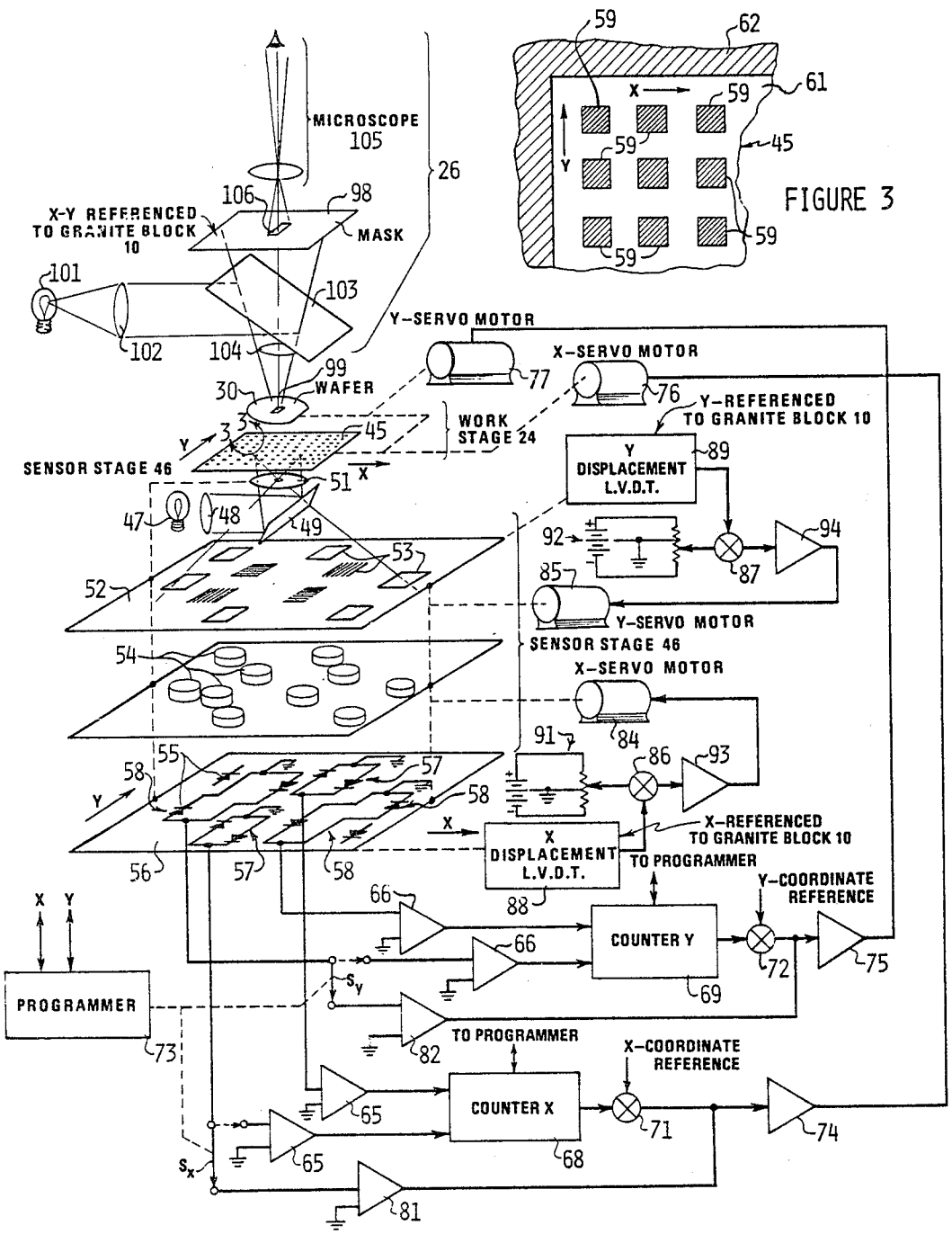
FIG. 2 is a schematic perspective view, partly in block diagram form, of the mask aligner of FIG. 1.
FIG. 3 is an enlarged detail view of a portion of the structure of FIG. 2 delineated by line 3—3.

Referring now to FIGS. 1 and 2, there is shown a step-and-repeat projection alignment and exposure machine 20 incorporating features of the present invention. This machine 20 includes a base unit 22, a work stage unit 24 supported on the base unit 22 to receive the workpiece and for precisely controlled X and Y axis horizontal positioning of the workpiece. An optical unit 26 is supported from the base unit 22. An automatic workpiece handling unit 28 is included for transporting workpieces 30, such as wafers, to and from the precision work stage unit 24.

The base unit 22 includes a granite block 10 having an upper reference surface which is flat to within one micron across the surface thereof and having a cylindrical bore extending vertically therethrough for containing an optical sensing stage 46 therewithin.

In operation, the operator introduces a workpiece, such as wafer 30, into the machine 20 which then precisely positions the wafer on the work stage 24. The operator moves a microscope portion 105 of the optical tower 26 into position for viewing the major surface of a mask which is to be precisely optically aligned with an addressed region of a major face of the wafer 30 for exposure of the wafer to the pattern of a mask 98. The operator selects a reference address portion of the wafer to receive the exposure pattern projected through the mask. X and Y servo motors 76 and 77 are coupled to the work stage to cause the work stage to be moved so as to bring an X-Y coordinate system 45 of indicia affixed to the work stage into alignment over the relatively stationary optical sensor stage 46 contained within the granite block. The operator views the reference addressed location of the wafer being illuminated by light projected through the optical tower onto the reference addressed surface of the wafer. The illuminated image of the addressed surface portion of the wafer is projected onto the back side of the mask for superimposing the image of the mask and the image of the addressed portion of the wafer. The superimposed images are observed by the operator through the microscope and mask and the controls are manipulated to adjust the position of the sensor stage which causes a slight correction to be made in the position of the work stage for precisely aligning the pattern on the wafer with the pattern of the mask and this also zeros the addressed location, i.e., it produces an interpolated value for the X and Y coordinates of the addressed region of the wafer. The operator moves the microscope out of the way and moves a projection light source 29 into position in the tower. The wafer is exposed to the image of the mask through a projection lens and the wafer is then moved to the next exposure address by the operator inserting the next address into the programmer which causes the work stage to advance to the next reference addressed location which has been zeroed by the previous alignment step. The wafer is sequentially exposed by this step-and-repeat process until the wafer is totally exposed. When the exposure is complete the operator or programmer initiates operation of the wafer transport system which removes the exposed wafer and advances a new wafer into position on the work stage.

Referring now to FIG. 2 there is shown the addressable X-Y workpiece positioning system incorporating features of the present invention. More particularly, the wafer 30 is positioned and affixed to the X-Y work stage 24 having an array of X-Y coordinate addressing indicia 45 affixed to and movable with the X-Y translatable work stage 24.

The relatively stationary sensor stage 46, as mounted within the cylindrical bore of the granite block, is disposed below the X-Y array of addressing indicia 45. A lamp 47 provides illumination which is projected by lens 48 into a beam directed onto a beam splitting mirror 49 which directs the illumination through a magnifying lens 51 onto a relatively small region of the X-Y addressing indicia for illuminating same.

The illuminated image of the X-Y addressing indicia 45 is projected via the magnifying lens 51 through the beam splitting mirror 49 and focused onto a sensing window plate 52 having a plurality of pattern recognition windows therein for recognizing the X and Y coordinate indicia. In a typical example, the magnification M of lens 51 is thirteen times such that the indicia image, as projected onto the sensing window plate 52, is thirteen times actual size. Sensing window plate 52 includes a plurality of different windows 53 formed therein. The windows 53 permit the light incident thereon to pass therethrough to stick lenses 54 arranged in registration with each of the windows 53. The stick lenses 54 receive the light passing through the respective windows 53 and focus that light onto respective PIN diodes 55 disposed on a diode sensing plate 56 of the sensor stage 46.

Two pairs 57 of the diodes 55 are arranged for recognizing and sensing the X coordinates of the addressing indicia array, whereas a second two pairs 58 of diodes 55 are arranged and connected for sensing the Y coordinates of the indicia addressing array 45. The diodes of each pair 57 and 58 are connected in bucking relation so as to provide a zero output when the illumination is equal on each respective diode of the pair.

Referring now to FIG. 3, there is shown the array of X and Y coordinate addressing indicia 59. The indicia 59 comprise, for example, square dots of chromium plating on a fused silica plate 61. A border 62 of chromium plating surrounds the array of X and Y coordinate indicia 59. The indicia 59 are arranged in columns and rows. The X coordinates comprise the columns and the Y coordinates comprise the rows. Thus, each addressable location on the work stage 24 is defined by a given dot 59 having a column number corresponding to the number of the X coordinate columns and a row number cooresponding to the number of Y coordinate rows to the addressed location or dot 59. In a typical example, the indicia 59 are square dots 10 microns on a side located on 20 micron centers in both the X and Y direction.

The column and row recognition windows 53 in the window plate 52 are of generally two kinds. A first kind of window is a clear rectangle having an area, as of 100 M×120 M square microns equal to a 5×6 sub array of dot indicia 59, and it is paired with a window of the second type comprising an array of eight parallel elongated slot-shaped windows, each of sic of the slot windows of the array having a width as of 10 M microns and a length as of 160 M microns and each of 2 of the windows having a length as of 120 M microns so as to permit eight or six relatively dot indicia 59 to be observed through each respective slot window of the array. Thus, the slot array window permits sixty indicia to be observed, whereas, the smaller rectangular window of each pair permits the illumination from 30 indicia to pass therethrough. Thus, the outputs from the bucking connection diode pairs 57 or 58 will be zero or a null when the indicia 59 which are aligned parallel to the slot windows of a particular sensing array window 53 are half covered by the opaque spacing between the respective slot windows of the array 53, i.e., the marginal lip of each slot of the array falls along the center points of the respective column or row of dots being recognized.

Figure 4:
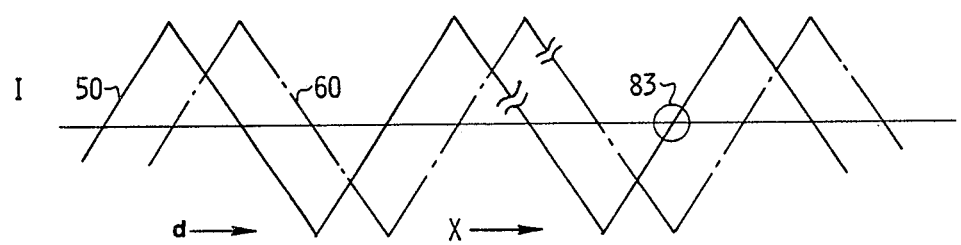
FIG. 4 is a plot of sensor output as a function of movement of the work stage in the X direction.

Each diode sensor pair 57 or 58 produces a triangular output waveform 50 and 60 of current of the type shown in FIG. 4 as the X-Y work stage 24 is moved. In addition, the window pairs in the window sensing plate 52 which correspond to each of the sensor pairs 57 or 58 are offset relative to the other window pairs in the respective X or Y direction by an amount equal to ¼ of the period of the enlarged addressed indicia as projected onto the window plate 52, i.e., 5 M microns. This ¼ spacing offset results in producing a 90° spacial offset in the electrical signals 50 and 60 derived from the two pairs 57 or two pairs 58 depending upon which set of coordinates X or Y is being sensed. More particularly, a typical 90° spacial offset pair of waveforms is shown in FIG. 4. When the work stage 24 is being advanced in the positive X direction the waveform from a first pair of the sensors 57, i.e., waveform 50 will lead the other waveform 60 derived from the second pair of sensors 57, whereas when the work stage 24 is being advanced in the minus X direction, the second waveform 60 will lead the first waveform 50.

Each cycle of the respective waveform 50 or 60 corresponds to counting of a given column or row depending upon whether the waveforms correspond to the X or Y pairs of sensors 57 or 58, respectively. Similarly, the two Y coordinate pairs 58 of sensor windows 53 and diodes 55 are offset in the Y direction on the window plate 52 and diode plate 56 by ¼ of the enlarged spacing of the indicia image projected onto the window plate 52 for deriving the 90° spacial offset waves of a waveform similar to that shown in FIG. 4 for the Y coordinate movement of the work stage 24.

Figure 5:
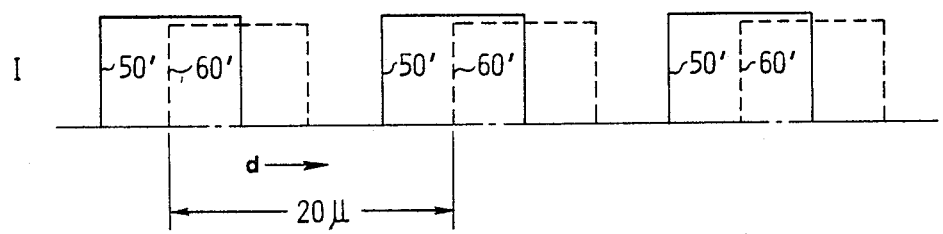
FIG. 5 is a plot of the waveform output in response to the sensor output of FIG. 4.

The outputs from the respective X and Y coordinate sensor diode pairs 57 and 58 are fed through respective amplifiers and wave shapers 65 and 66, respectively. Each of the amplifiers and wave shapers 65 and 66 takes the respective triangular shaped current input signal 50 or 60 and produces a square wave signal 50' and 60' of the type shown in FIG. 5. Thus, there is one square wave pulse per row or column of the respective address indicia as scanned across the sensor window plate 52. When the output signals 50' or 60' from the wave amplifiers and shapers 65 and 66 are such that the output from a first one of the sensor pairs leads the output of the second sensor pair, corresponding to positive X or Y direction movement, the output of the amplifiers 65 or 66 are latched in the counter so that a positive count is produced in the respective X or Y counter 68 or 69 for counting columns or rows in a positive direction, whereas when the output of the first pair 50' lags the output 60' of the second diode pair, the respective counter 68 or 69 is latched to count in the minus X or Y direction. The outputs of the X and Y counters 68 and 69 are fed to respective error detectors 71 and 72 for comparison with X and Y coordinate reference address inputs derived from a programmer 73 programmed by the operator to select predetermined workpiece address locations. The error output derived from the respective error detector 71 and 72 is fed to a responsive servo amplifier 74 and 75, the outputs of which are fed to respective work stage X and Y servo motors 76 and 77 for driving the work stage 24 in such a direction as to cause the error from the output of the address error detectors 71 and 72 to go toward zero.

Figure 6:
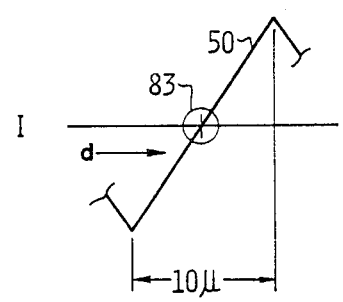
FIG. 6 is a plot of an analog output signal derived from the position sensor stage operating in the lock mode when the sensor stage is locking the work stage to the reference addressed X coordinate location.

The programmer 73 keeps track of the counted number of rows and columns and of the remaining number of column and rows to reach the addressed X and Y coordinates and controls the rate at which the servo motors 76 and 77 move the work stage 24 so that certain predetermined acceleration and deceleration limits are not exceeded. For example, the programmer 73 controls the acceleration and deceleration to 1/10th of a g. Also, when the error count is within one column or row of the respective referenced coordinate of the addressed location, the programmer 73 switches $S_x$ and $S_y$, respectively, for causing the X and Y servo motors 75 and 76 to lock the stopping point of the respective X and Y positions to a crossover 83 of the output signal 50 derived from the respective detectors 57 and 58 as shown at 83 in the waveform 50 of FIG. 4 and by 83 in the waveform 50 in FIG. 6.

The outputs of the analog servo amplifiers 81 and 82 are fed to the inputs of respective servo amplifiers 74 and 75 for causing the X and Y servo motors 76 and 77 to lock at the crossover position 83. The crossover position 83 corresponds to the center of a 10 micron wide region on the workpiece in both the X and Y directions and is precisely determined and repeatable with error less than 1/10 of a micron. Thus, the work stage 24 can be programmed to move to any one of a number of addressable locations which are spaced at 20 micron intervals in both the X and Y directions over the surface of the workpiece or wafer 30. In addition, these addressed positions can be repeatably addressed to within 1/10 of a micron.

In addition, See FIG. 2) the selected address locations can be interpolated i.e., changed relative to a fixed position on the granite block 10, to plus or minus 20 microns in both the X and Y direction by producing a relatively slight displacement of the sensor stage relative to the granite block. More particularly, the sensor stage 46, including the sensor window 52, is displaceable in both the X and Y directions by means of X and Y sensor stage servo motors 84 and 85. The servo motors are controlled from the output of respective X and Y error detectors 86 and 87. The respective outputs of an X displacement linear variable differential transformer 88 and from a Y displacement linear variable differential transformer 89 which are fixedly referenced to the granite block for detection of X and Y displacements of the sensor stage 46, are fed into the respective error detectors 86 and 87 for comparison with reference signals derived from X and Y reference potentiometers 91 and 92 under the control of the operator. The error signals from error detectors 86 and 87 are amplified in servo amplifiers 93 and 94 and are fed to the servo motors 84 and 85, respectively.

Thus, the sensor stage reference potentiometers 91 and 92 permit interpolation of the selected address coordinates X and Y to be zeroed (interpolated), to better than 1/10 of a micron in both the X and Y directions.

In a preferred embodiment of a mask aligner system as shown in FIG. 2, it is desired that the operator have control over the interpolation settings of the potentiometers 91 and 92. However, in a totally automated system for a workpiece positioner, the reference inputs for interpolating the address location for comparison against the outputs of the linear variable differential transformers 88 and 89 could be selected by the programmer 73.

The operator controlled interpolation of the X and Y coordinates of the addressed location of the wafer 30 as permitted by the potnetiometer controls 91 and 92 is particularly advantageous for use in a step-and-repeat wafer exposure machine for aligning a photographic mask 98 with a pattern at a selected addressed location 99 on the wafer 30. More particularly, the addressed location on the surface of the wafer is illuminated by means of a lamp 101 the light from which is received in an illumination projection lens 102 and thence reflected off of a beam splitting mirror 103 throgh a projection lens 104 onto the addressed location 99 of the wafer 30. The illuminated image pattern of the addressed location 99 on the surface of the wafer is imaged back through the projection lens 104 onto the underside of the mask 98. The pattern image of the wafer location as projected onto the underside of the mask 98 is observed through the mask by means of the microscope 105. Thus, the operator by observing, through the microscope 105, a minute portion 106 of the mask 98 is able to observe the minute superimposed pattern of the mask and of the imaged pattern derived from the illuminated area 99 of the wafer.

In case the wafer 30 has been through one or more steps in its processing, a circuit image pattern is observable in the illuminated area of the wafer 99 and the corresponding mask pattern is observable through the microscope 105. These superimposed image patterns can then be brought into precise alignment by the operator by observing the two superimposed patterns through the microscope 105 and adjusting the interpolating reference potentiometers 91 and 92 to obtain precise and exact alignment of the two images to better than 1/10th of a micron. This is obtainable because the mask 98 is stationary in the X-Y coordinates relative to the stationary granite block and the illuminated pattern 99 on the wafer 30 moves relative to the mask 98 and granite block with movement of the wafer 30 which is locked via the X and Y servo motors 76 and 77 and servo loops to movement of the sensor stage 46.

The interpolated addressed wafer 30 is then exposed to the pattern of the mask 98 by projecting the illuminated mask image through the projection lens 104 onto the wafer 30. The interpolated or zeroed address is than a reference position from which the programmer 73 automatically causes the work stage 24 to be sequentially positioned to other predetermined address locations spaced from each other on the wafer by predetermined distances related to the size of the image of the mask as projected onto the wafer, for sequentially exposing the wafer 30 to the image pattern of the mask 98. This step-and-repeat projection exposure system permits the adjustments to be made in the location of the addresses in order to compensate for slight positioning errors of the wafer 30 on the work stage 24 by the automatic workpiece handling unit 28 during the wafer loading sequence.

Thus, an X-Y addressable workpiece positioner and mask aligner and exposure machine using same has been described which has the advantage of permitting the workpiece to be addressed sequentially to addressable locations precisely determinable to better than 1/10 of a micron. The stepping of the workpiece from one addressable location to the next is accomplished by movement of the wafer along a path which is the shortest distance between the two addressed locations and which is precisely defined by a common two dimensional array of address indicia, thereby shortening the addressing time and increasing the throughput of the machine, with the accuracy of the addressed locations being precisely determined by the precise positioning of X and Y coordinate indicia without dependence for accuracy upon the precision of the orthogonality of costly bearing assemblies or later interferometers requiring environmentally controlled chambers.

The corner diodes 55 and corresponding windows 53 of the sensor stage 46 are connected into the programmer 73 for sensing the border 62 for referencing the row and column count of the addressing indicia 59.

As used herein, a "two dimensional array" of address indicia shall be defined to include indicia arrayed, i.e., serialized, in two directions. Thus, a series of parallel lines is a one dimensional array, whereas a series of dots serialized in two directions, as in FIG. 3, comprises a two dimensional array. A series of concentric rings with a series of radial spokes is a two dimensional array.

What is claimed is:

1. A servo control system comprising:
   stage means movable along orthogonal axes for positioning a workpiece relative to a work apparatus;
   first and second drive means respectively responsive to first and second drive signals and operative to drive said stage means along said axes;
   position detector means for monitoring the position of said stage means relative to the work apparatus and including
      a reference substrate carried by said stage means and having orthogonal dimension position related indicia disposed thereupon, and
      means for sensing said indicia and developing first and second actual position signals corresponding to the positioning of said substrate along said axes;
   input means for generating first and second desired position signals corresponding to positions along said axes to which said stage means is to be driven; and
   first and second position control means for respectively comparing said first and second desired position signals to said first and second actual position signals and for developing said first and second drive signals for application to said first and second drive means respectively to cause said workpiece to be driven to a desired position.

2. A servo control system as recited in claim 1 wherein said indicia are embodied in a plurality of uniformly configured reflective surface areas of said substrate uniformly arrayed in rows and columns.

3. A servo control system as recited in claim 1 or 2 wherein each element of said indicia is rectangular in configuration.

4. A servo control system as recited in claim 1 wherein said substrate is translucent and said indicia are opaque.

5. A servo control system as recited in claim 1, 2 or 4 wherein said means for sensing said indicia includes light source means and photodetector means.

6. A servo control system as recited in claim 1 wherein said position detector means includes an optical system for casting an image of at least a portion of said reference substrate onto an apertured reticle, and photodetection means disposed behind the apertures of said reticle and operative to generate electrical outputs from which said first and second actual position signals are developed, said control system further comprising:
   third drive means responsive to a third drive signal and operative to move said reticle in a first direction relative to said optical system;
   fourth drive means responsive to a fourth drive signal and operative to move said reticle in a second direction relative to said optical system;
   first reticle follower means for developing a first reticle position signal;
   second reticle follower means for developing a second reticle position signal;
   first reticle position control means including a first servo system responsive to a first input adjust signal and said first reticle position signal and operative to generate said third drive signal; and
   second reticle position control means including a second servo system responsive to a second input adjust signal and said second reticle position signal and operative to generate said fourth drive signal.

7. A servo control system as recited in claim 1 wherein said position detector means includes an optical system for casting an image of at least a portion of said reference substrate onto an apertured reticle, and photodetection means disposed to receive said image and operative to generate electrical signals from which said first and second actual position signals are developed.

8. A servo control system as recited in claim 7 wherein the indicia contained on said reference substrate include a plurality of like, rectangularly-shaped reflective surface areas arrayed in orderly rows and columns.

9. A servo control system as recited in claim 8 wherein said reference substrate includes a reference strip comprising a reflective band circumscribing said reflective surface areas.

10. A servo control system as recited in claim 7 wherein the indicia contained on said reference substrate include a plurality of like, rectangularly-shaped opaque surface areas arrayed in orderly rows and columns.

11. A servo control system as recited in claim 10 wherein said reference substrate includes a reference strip comprising an opaque band circumscribing said opaque surface areas.

12. A servo control system as recited in claim 1 wherein said position detector means includes means for illuminating said indicia and photosensitive means for detecting movement of said indicia relative to said photosensitive means.

* * * * *